US012812902B2

(12) United States Patent
Chen

(10) Patent No.: US 12,812,902 B2
(45) Date of Patent: Nov. 24, 2026

(54) SEMICONDUCTOR DEVICE AND MANUFACTURING METHOD THEREOF

(71) Applicant: Hon Young Semiconductor Corporation, Hsinchu City (TW)

(72) Inventor: Yan-Ru Chen, Hsinchu City (TW)

(73) Assignee: Hon Young Semiconductor Corporation, Hsinchu City (TW)

( * ) Notice: Subject to any disclaimer, the term of this patent is extended or adjusted under 35 U.S.C. 154(b) by 338 days.

(21) Appl. No.: 18/650,096

(22) Filed: Apr. 30, 2024

(65) Prior Publication Data

US 2025/0142878 A1 May 1, 2025

Related U.S. Application Data

(60) Provisional application No. 63/593,230, filed on Oct. 25, 2023.

(30) Foreign Application Priority Data

Mar. 4, 2024 (TW) ................................ 113107785

(51) Int. Cl.

*H10D 30/66* (2025.01)
*H10D 30/01* (2025.01)
*H10D 62/10* (2025.01)
*H10D 64/27* (2025.01)

(52) U.S. Cl.

CPC ....... *H10D 30/668* (2025.01); *H10D 30/0297* (2025.01); *H10D 62/109* (2025.01); *H10D 64/516* (2025.01)

(58) Field of Classification Search

CPC ............. H10D 30/668; H10D 30/0297; H10D 62/109; H10D 64/516; H10D 62/107; H10D 64/513

See application file for complete search history.

(56) References Cited

U.S. PATENT DOCUMENTS

| | | | | |
|---|---|---|---|---|
| 8,299,517 B2* | 10/2012 | Jang | H10B 12/053 257/302 |
| 9,837,492 B2 | 12/2017 | Sumida et al. | |
| 2006/0267085 A1* | 11/2006 | Matsuura | H10D 12/481 257/330 |
| 2009/0072306 A1 | 3/2009 | Izumi | |
| 2009/0078995 A1 | 3/2009 | Nakagawa et al. | |
| 2009/0127617 A1 | 5/2009 | Shin et al. | |

(Continued)

FOREIGN PATENT DOCUMENTS

| | | |
|---|---|---|
| JP | 2013214696 A | 10/2013 |
| JP | 2013219171 A | 10/2013 |

(Continued)

*Primary Examiner* — Syed I Gheyas

(74) *Attorney, Agent, or Firm* — CKC & Partners Co., LLC

(57) ABSTRACT

A manufacturing method of a semiconductor device includes forming an epitaxial layer over a substrate, forming a well region and a source region in the epitaxial layer, forming a first trench in the epitaxial layer, in which the first trench has a round corner protruding to the well region, forming a second trench in the epitaxial layer, in which the bottom of the second trench is higher than the bottom of the first trench and the width of the second trench is greater than the width of the first trench, and forming a gate structure in the first trench and the second trench.

20 Claims, 7 Drawing Sheets

(56) References Cited

U.S. PATENT DOCUMENTS

| | | | | |
|---|---|---|---|---|
| 2013/0264637 | A1 * | 10/2013 | Katou .................... | H10D 30/63 257/331 |
| 2014/0167151 | A1 | 6/2014 | Yen et al. | |
| 2016/0233105 | A1 | 8/2016 | Li | |
| 2016/0336443 | A1 * | 11/2016 | Sumida .............. | H10D 30/0295 |
| 2019/0081147 | A1 * | 3/2019 | West .................. | H10D 30/0295 |
| 2021/0167191 | A1 | 6/2021 | Gu et al. | |
| 2023/0207682 | A1 | 6/2023 | Imam et al. | |

FOREIGN PATENT DOCUMENTS

| | | | |
|---|---|---|---|
| JP | 2016219495 | A | 12/2016 |
| JP | 2018022858 | A | 2/2018 |
| JP | 2019087591 | A | 6/2019 |
| JP | 2019192693 | A | 10/2019 |
| TW | 201203554 | A | 1/2012 |
| TW | M659533 | U | 8/2024 |
| WO | 2016042955 | A1 | 3/2016 |

* cited by examiner

SEMICONDUCTOR DEVICE AND MANUFACTURING METHOD THEREOF

CROSS-REFERENCE TO RELATED APPLICATION

This application claims priority to U.S. Provisional Application Ser. No. 63/593,230, filed Oct. 25, 2023, and Taiwan Application Serial Number 113107785, filed Mar. 4, 2024, the disclosures of which are incorporated herein by reference in their entireties.

BACKGROUND

Technical Field

Some embodiments of the present disclosure relate to a semiconductor device and a manufacturing method thereof.

Description of Related Art

To increase the channel density of a metal oxide semiconductor field effect transistors (MOSFET), the MOSFET may have a gate trench structure and a vertical channel. However, an over-concentrated electric field at the corner of the gate trench structure is likely to induce an excessively high on resistance of the MOSFET. For the foregoing reason, there is a need to solve the above-mentioned problem by providing a semiconductor device and a manufacturing method thereof.

SUMMARY

Some embodiments of the present disclosure provide a method of manufacturing a semiconductor device, including: forming an epitaxial layer on a substrate; forming a well region and a source region in the epitaxial layer; forming a first trench in the epitaxial layer, a corner of the first trench having a round corner protruding to the well region; forming a second trench in the epitaxial layer, the bottom of the second trench being higher than the bottom of the first trench, and the width of the second trench being greater than the width of the first trench; and forming a gate structure in the first trench and the second trench.

Some embodiments of the present disclosure provide a semiconductor device, including a substrate, an epitaxial layer, a gate structure, a source electrode and a drain electrode. The epitaxial layer is on the substrate. The gate structure is in the epitaxial layer, where the gate structure has a first part, a second part and a third part from bottom to top, the width of the third part is greater than the width of the second part, and the width of the first part is greater than the width of the second part. The source electrode is on the epitaxial layer. The drain electrode is below the substrate.

DETAILED DESCRIPTION

Some embodiments of the present disclosure relate to a semiconductor device, and a gate structure of the semiconductor device has a first part, a second part and a third part from bottom to top. The width of the third part is greater than the width of the second part, and the width of the first part is greater than the width of the second part. The first part of the gate structure can be used to avoid electric field concentration at the corner of the gate structure, which can thus reduce the on resistance of the semiconductor device.

Figure 1:
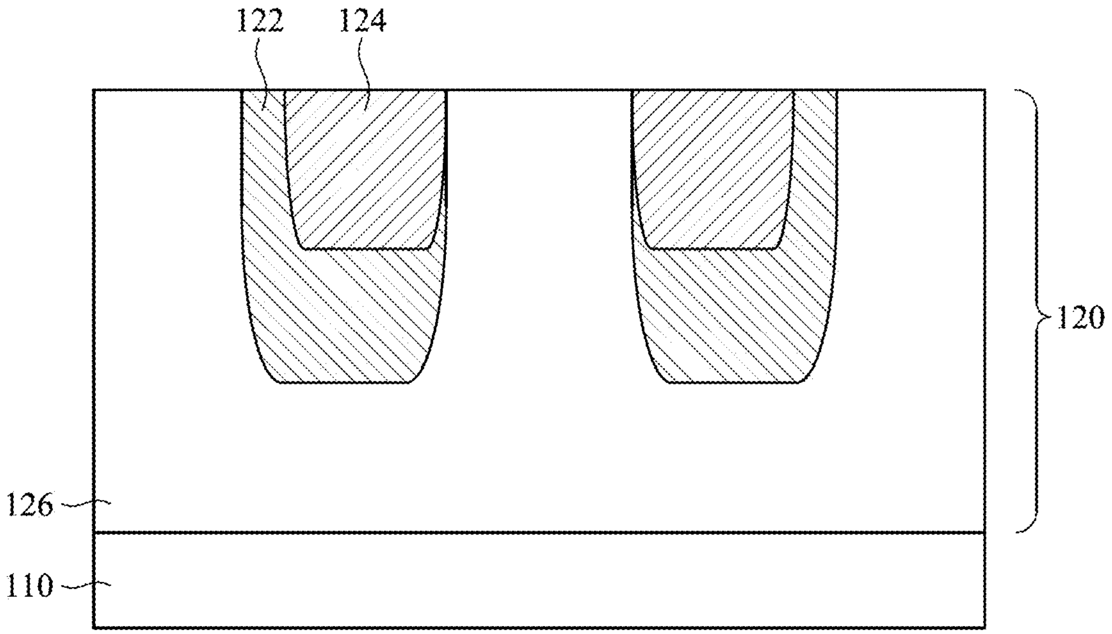
FIG. 1 to FIG. 6 illustrate a cross-sectional view of a semiconductor device according to some embodiments of the present disclosure.

FIG. 1 to FIG. 6 illustrate a cross-sectional view of a semiconductor device according to some embodiments of the present disclosure. Referring to FIG. 1, an epitaxial layer 120 is formed on the substrate 110. The substrate 110 and the epitaxial layer 120 can be made from a semiconductor material, such as silicon, silicon carbide, analogues or combinations thereof. The substrate 110 and the epitaxial layer 120 may have a first conductivity type, and the substrate 110 may be a heavily-doped region while the epitaxial layer 120 may be a lightly-doped region. In some embodiments, the substrate 110 may be an N-type heavily-doped substrate, and the epitaxial layer 120 may be an N-type lightly-doped region. In some embodiments, the doped region of a first conductivity type may include an N-type dopant, such as nitrogen, arsenic and phosphorus.

Then, a well region 122 and a source region 124 are formed in the epitaxial layer 120. In some embodiments, a thermal oxidation procedure can be performed for the epitaxial layer 120 at first, to form a silicon oxide layer on the surface of the epitaxial layer 120. Then, a first patterned photoresist layer can be formed on the epitaxial layer 120, and an ion implantation procedure is performed to implant ions of a second conductivity type into the epitaxial layer 120, to form the well region 122. The position of the well region 122 is defined by the first patterned photoresist layer. Then, the first patterned photoresist layer is removed, and a second patterned photoresist layer is formed on the epitaxial layer 120. An ion implantation procedure is performed to implant ions of a first conductivity type into the epitaxial layer 120, to form the source region 124. The position of the source region 124 is defined by the second patterned photoresist layer. After the formation of the source region 124 and the well region 122, the second patterned photoresist layer and the silicon oxide layer can be removed by a wet etching procedure. In some embodiments, one side of the source region 124 can be substantially aligned with one side of the well region 122, and the source region 124 does not completely cover the well region 122. That is to say, the top of the well region 122 is still partially exposed. In addition, the bottom of the well region 122 is lower than the bottom of the source region 124. The well region 122 may have a second conductivity type, and the source region 124 may have a first conductivity type. The well region 122 may be a lightly or moderately-doped region, and the source region 124 may be a heavily-doped region, namely, the doping concentration of the source region 124 is greater than that of the well region 122. In some embodiments, the well region 122 may be a P-type lightly or moderately-doped region, and the source region 124 may be an N-type heavily-doped region. After the formation of the well region 122 and the source region 124, the remaining part not occupied by the well region 122 and the source region 124 is a drift region 126, and the drift region 126 is a lightly-doped region of a first conductivity type, for example, an N-type lightly-doped region. The doping concentration of the source region 124 is greater than that of the drift region 126. In some embodiments, the doped region of a first conductivity type may include an N-type dopant, such as nitrogen, arsenic and phosphorus. In some embodiments, the doped region of a second conductivity type may include a P-type dopant, such as boron, aluminum and gallium.

Figure 2:
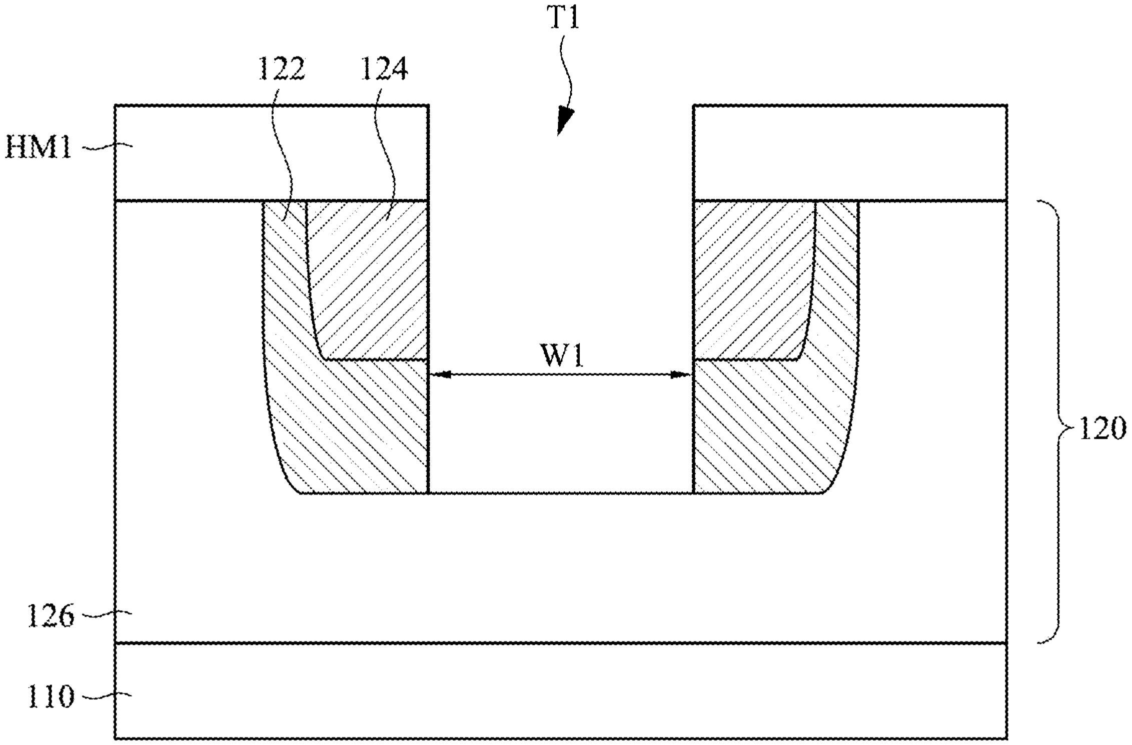

Referring to FIG. 2, a trench T1 is formed in the epitaxial layer 120. Specifically, a hard mask layer HM1 can be formed on the epitaxial layer 120, and the hard mask layer HM1 exposes the part of the drift region 126 between adjacent source regions 124. In some embodiments, the hard mask layer HM1 can be made from a dielectric material, such as silicon nitride, silicon oxide, analogues or combinations thereof. Then, with the hard mask layer HM1 as an etching mask, a trench T1 is formed in the epitaxial layer 120. The trench T1 can be made by a dry etching procedure. The trench T1 has a vertical side wall (for example, a side wall substantially vertical to the bottom of the substrate 110), the bottom of the trench T1 exposes the drift region 126 of the epitaxial layer 120 and is substantially flush with the bottom of the well region 122, and the side wall of the trench T1 exposes the well region 122 and the source region 124. Therefore, the drift region 126 and the well region 122 are exposed simultaneously near the corner of the trench T1. In some embodiments, a width W1 of the trench T1 may be 0.8-1.1 μm. In some embodiments, a depth of the trench T1 may be 2.2-2.5 μm.

Figure 3:
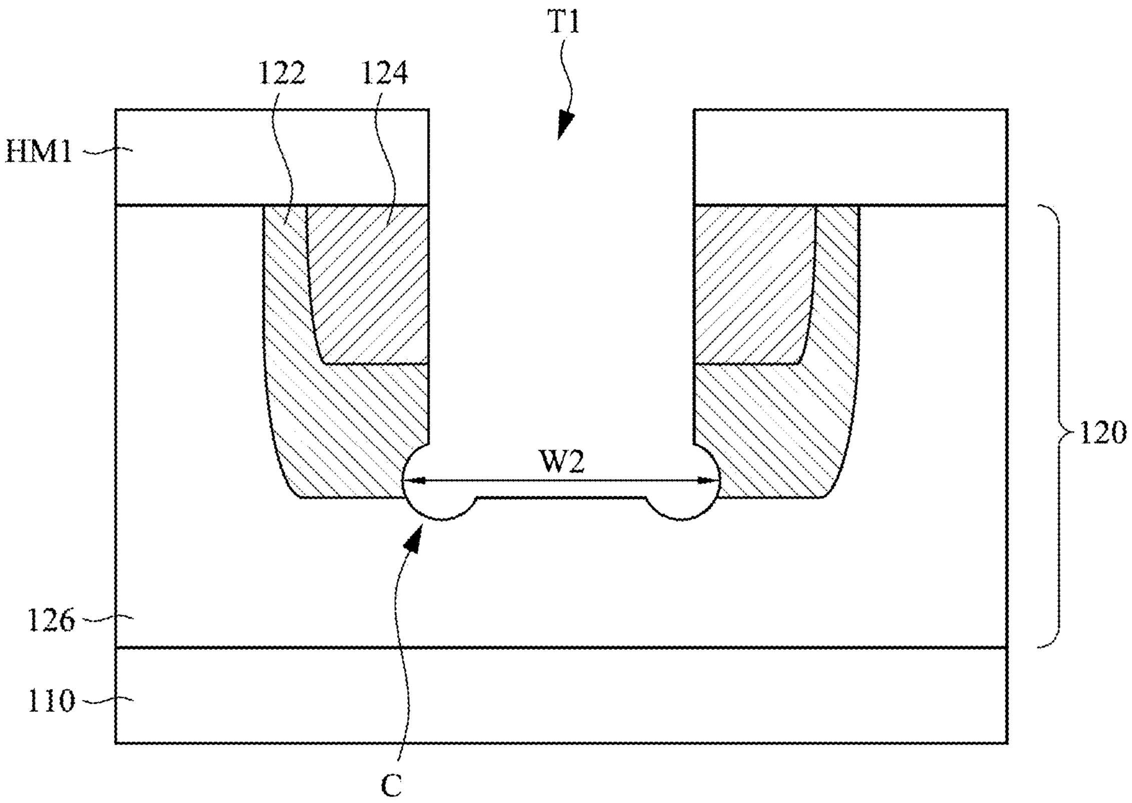

Referring to FIG. 3, a selective etching procedure is performed to form a round corner C protruding to the well region 122 at the corner of the trench T1. Specifically, the drift region 126 and the well region 122 are exposed simultaneously near the corner of the trench T1, and the drift region 126 and the well region 122 have dopants of different conductivity types. When the same material is doped with different kinds of dopants, it has selectivity on specific etching procedure. For example, the selective etching procedure may have a relatively high etching rate on a P-type doped region, but a relatively low etching rate on an N-type doped region. Therefore, a proper etching procedure can be selected to form the round corner C protruding to the well region 122 at the corner of the trench T1. Specifically, the rate of etching the well region 122 (for example, P-type doped region) by the selective etching procedure is greater than the rate of etching the drift region 126 (for example, N-type doped region), and thus the round corner C can be formed in the well region 122. Therefore, the trench T1 can be formed in the epitaxial layer 120, the trench T1 has a vertical side wall and a round corner C protruding to the well region 122, and the width of the bottom of the trench T1 is greater than the width of the top of the trench T1. In some embodiments, a maximum width W2 (the width of the part of the trench T1 having the round corner C) of the trench T1 may be 1.2-1.5 μm. On the other hand, the edge of the round corner C exceeds the side wall of the trench T1 while the bottom of the round corner C is lower than a bottom surface of the trench T1.

Figure 4:
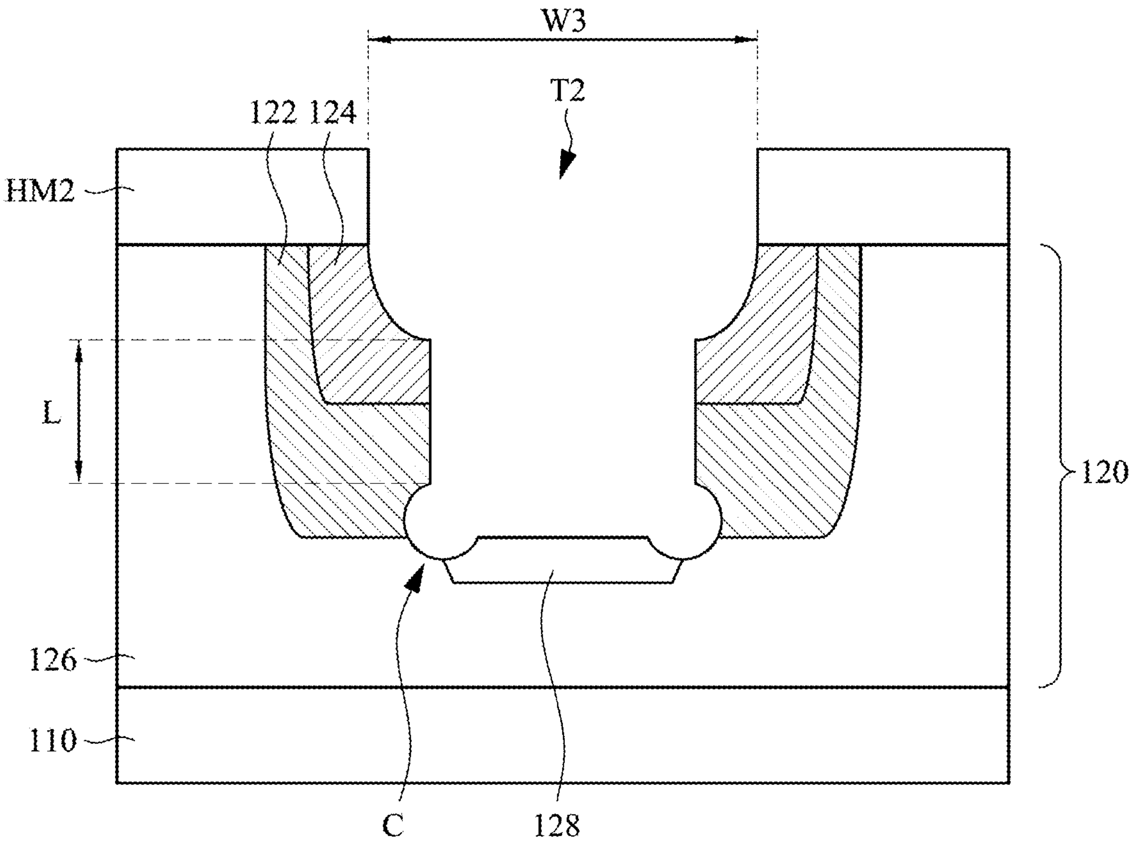

Referring to FIG. 4, after the formation of the round corner C of the trench T1, a shielding region 128 is formed at the bottom of the trench T1. Specifically, with the hard mask layer HM1 (FIG. 3) as a mask, an ion implantation procedure can be performed to implant ions of a second conductivity type into the epitaxial layer 120, to form the shielding region 128. The shielding region 128 may have a second conductivity type, and may be a heavily-doped region. In some embodiments, the shielding region 128 may be a heavily-doped region, and the doping concentration of the shielding region 128 is greater than that of the well region 122 and the drift region 126. After the formation of the shielding region 128, the hard mask layer HM1 is removed. In some embodiments, the doped region of a second conductivity type may include a P-type dopant, such as boron, aluminum and gallium.

Then, a hard mask layer HM2 can be formed on the epitaxial layer 120, and the hard mask layer HM2 exposes the trench T1 and part of the source region 124. In some embodiments, the hard mask layer HM2 can be made from a dielectric material, such as silicon nitride, silicon oxide, analogues or combinations thereof. Then, with the hard mask layer HM2 as an etching mask, a trench T2 is formed in the epitaxial layer 120. The bottom of the trench T2 is higher than the bottom of the trench T1, and the width of the trench T2 is greater than the width of the trench T1. In some embodiments, a width W3 of the trench T2 may be 1.6-1.8 μm. In some embodiments, the bottom of the trench T2 is higher than the bottom of the source region 124, and thus the trench T2 does not expose the well region 122. In some embodiments, after the formation of the trench T2, a length L of the vertical side wall of the trench T1 is be 1.0-1.2 μm.

Figure 5:
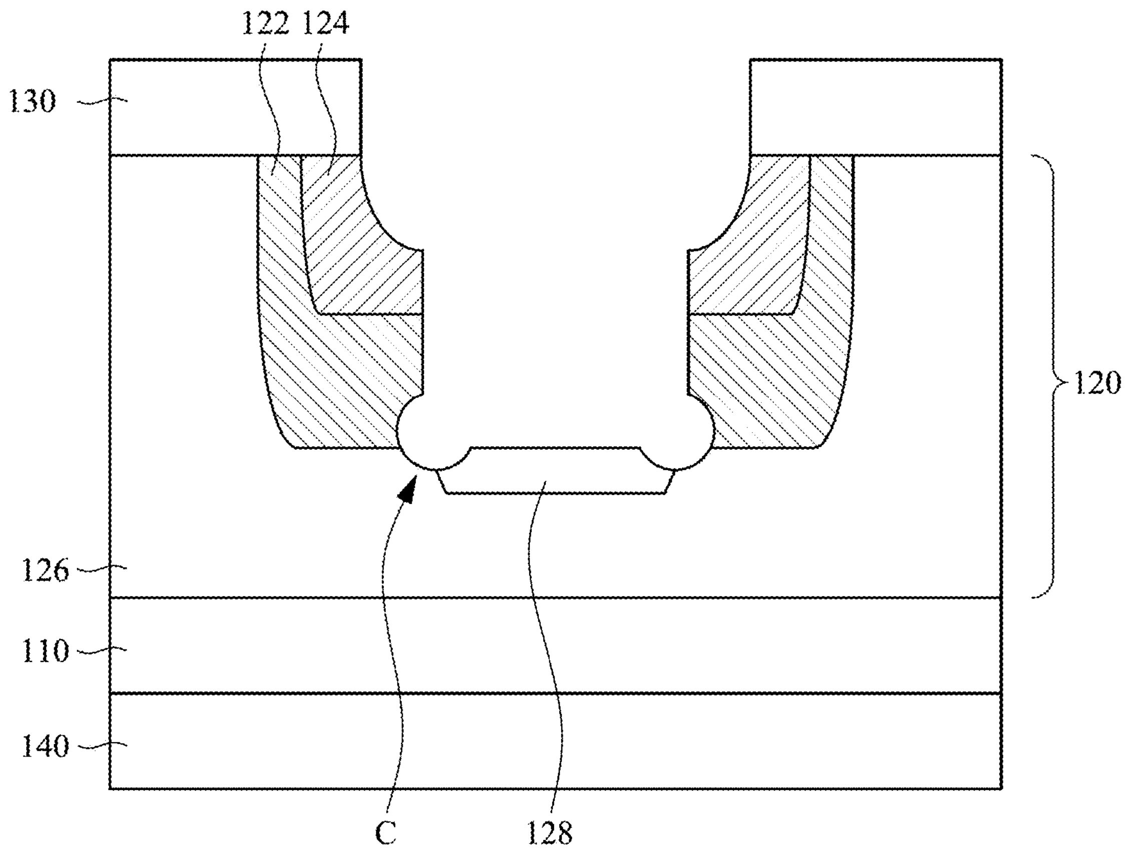

Referring to FIG. 5, the hard mask layer HM2 is removed by a wet etching procedure. Then, a source electrode 130 is formed on the well region 122 and the source region 124, and a drain electrode 140 is formed below the substrate 110. In some embodiments, the source electrode 130 and the drain electrode 140 can be made from a conductive material, such as metal.

Figure 6:
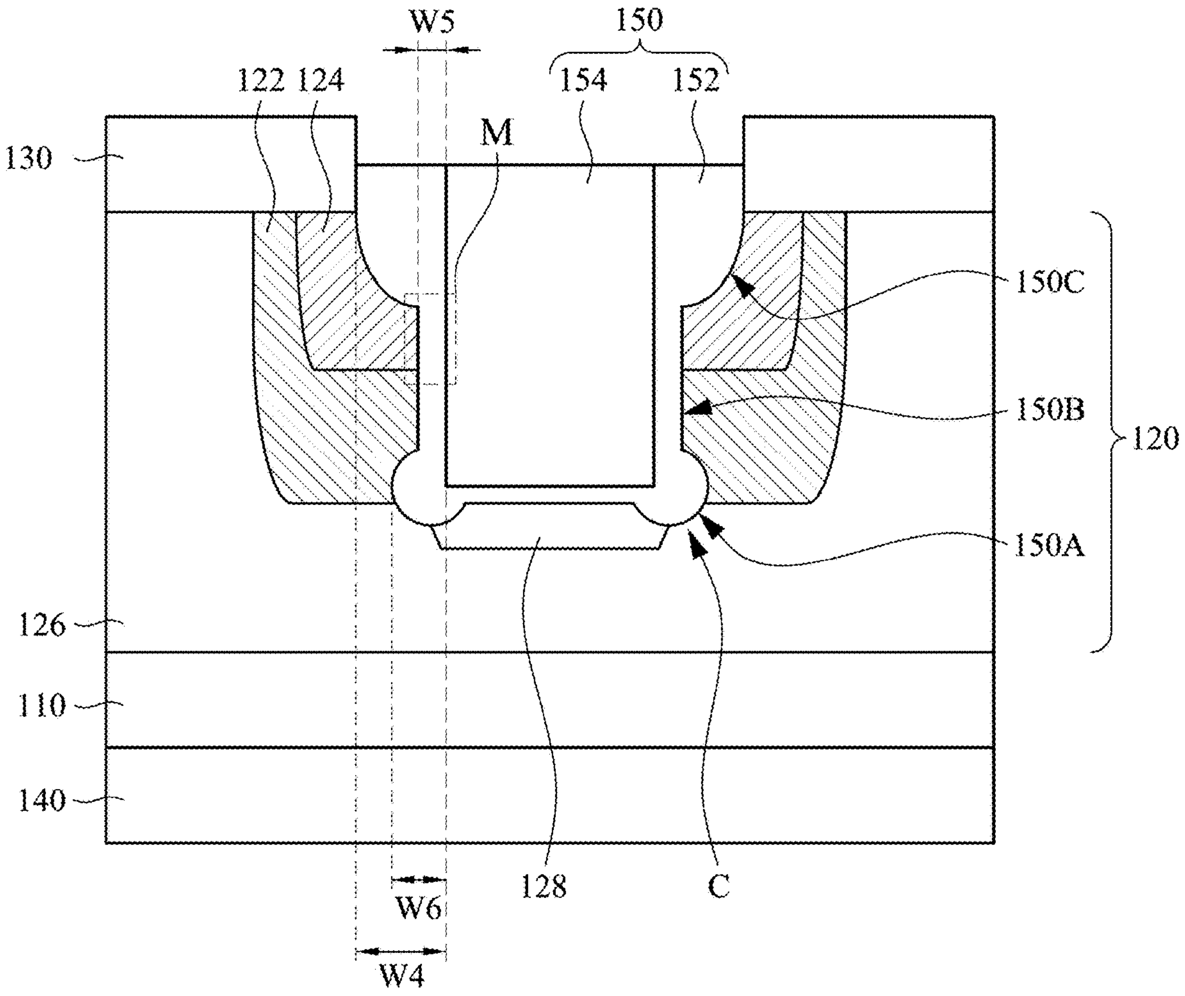

Referring to FIG. 6, a gate structure 150 is formed in the trench T1 and the trench T2. The gate structure 150 includes a gate dielectric layer 152 and a gate layer 154. The gate layer 154 is surrounded by the gate dielectric layer 152. A width W4 of the gate dielectric layer 152 in the trench T2 is greater than widths W5 and W6 of the gate dielectric layer 152 in the first trench T1. Specifically, a dielectric material can be filled in the trench T1 and the trench T2, and a trench is formed in the dielectric material. Then, a gate material layer is formed in the trench in the dielectric material. Therefore, a gate dielectric layer 152 and a gate layer 154 of the gate structure 150 can be formed in the trench T1 and the trench T2. The side wall of the gate layer 154 of the gate structure 150 is substantially vertical to the surface of the substrate 110, and thus the width W6 of the gate dielectric layer 152 surrounded by the round corner C of the trench T1 is greater than the width W5 of the gate dielectric layer 152 surrounded by the vertical side wall of the trench T1. In some embodiments, the gate dielectric layer 152 can be made from silicon oxide, silicon nitride or analogues. The gate layer 154 can be made from a semiconductor material or conductor material, for example, polycrystalline silicon or metal.

The obtained semiconductor device is shown in FIG. 6. The semiconductor device includes a substrate 110, an epitaxial layer 120, a gate structure 150, a source electrode 130 and a drain electrode 140. The epitaxial layer 120 is on the substrate 110. The gate structure 150 is formed in the trenches T1 and T2 of the epitaxial layer 120, and thus has a structure as described above for the trenches T1 and T2, the details of which are not further elaborated here. From another perspective, the gate structure 150 has a first part 150A, a second part 150B and a third part 150C from bottom to top, the width of the third part 150C is greater than the width of the second part 150B, and the width of the first part 150A is greater than the width of the second part 150B. The first part 150A of the gate structure 150 has a round corner C protruding outward. In some embodiments, the width of the third part 150C is also greater than the width of the first part 150A. The source electrode 130 is on the epitaxial layer 120. The drain electrode 140 is below the substrate 110. The epitaxial layer 120 includes a source region 124, a well region 122, a drift region 126 and a shielding region 128. The source region 124 is adjacent to the third part 150C of the gate structure 150, where the bottom of the third part 150C of the gate structure 150 is higher than the bottom of the source region 124, and the first part 150A of the gate structure 150 is in contact with the well region 122. The well region 122 is adjacent to the source region 124 and the gate structure 150. The shielding region 128 is at the bottom of the gate structure 150. In some embodiments, the source region 124 and the drift region 126 have a first conductivity type, the well region 122 and the shielding region 128 have a second conductivity type, and the second conductivity type is different from the first conductivity type.

The gate structure 150 of the semiconductor device according to some embodiments of the present disclosure includes a gate dielectric layer 152 and a gate layer 154. The gate layer 154 is surrounded by the gate dielectric layer 152, where the width of the gate dielectric layer 152 at the third part 150C of the gate structure 150 is greater than the width of the gate dielectric layer 152 at the first part 150A of the gate structure 150, and the width of the gate dielectric layer 152 at the first part 150A of the gate structure 150 is greater than the width of the gate dielectric layer 152 at the second part 150B of the gate structure 150. The gate dielectric layer 152 at the first part 150A of the gate structure 150 can be used for keeping the current path away from the corner part of the gate structure 150 of the gate structure 150, so that the current path is not affected by a strong electric field at the corner part of the gate layer 154 of the gate structure 150. Therefore, a relatively low on-resistance of the semiconductor device can be realized. The current path, from the drain electrode 140, can run through a junction among the drift region 126, the well region 122 and the gate structure 150, through a junction between the well region 122 and the source region 124, and then to the source electrode 130.

In addition, the semiconductor device of the present disclosure can reduce a capacitance between the source region 124 and the gate layer 154. Specifically, the capacitance between the source region 124 and the gate layer 154 can be determined by the gate dielectric layer 152 therebetween having a vertical side wall (for example, part M in FIG. 6, namely, a part where the gate dielectric layer 152 at the second part 150B of the gate structure 150 overlaps with the source region 124). When the gate structure 150 has a third part 150C which overlaps with the source region 124, the part where the second part 150B of the gate structure 150 overlaps with the source region 124 is reduced, thereby reducing the part where the gate dielectric layer 152 at the second part 150B of the gate structure 150 overlaps with the source region 124. Therefore, the capacitance between the source region 124 and the gate layer 154 can be reduced, to diminish the impact of the capacitance on the semiconductor device.

Figure 7:
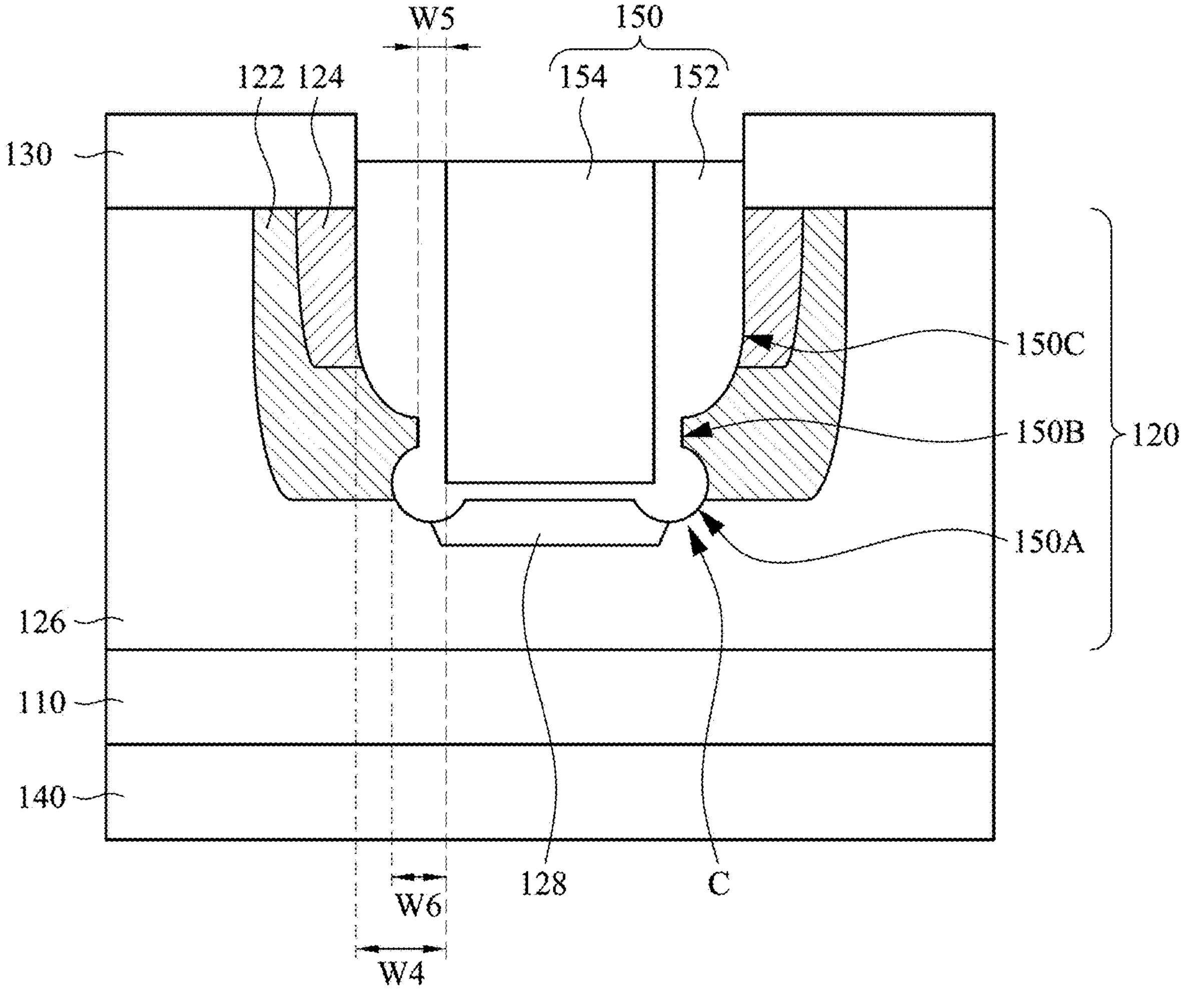
FIG. 7 illustrates a cross-sectional view of a semiconductor device according to some other embodiments of the present disclosure.

FIG. 7 illustrates a cross-sectional view of a semiconductor device according to some other embodiments of the present disclosure. The semiconductor device of FIG. 7 is similar to the semiconductor device of FIG. 6, with a difference in that during the formation of the semiconductor device of FIG. 7, when the trench T2 is being formed in the epitaxial layer 120 (referring to the steps of FIG. 4), the bottom of the trench T2 exposes the well region 122. Therefore, the third part 150C of the gate structure 150 of the semiconductor device is in contact with the well region 122 and the source region 124. When the third part 150C of the gate structure 150 is in contact with the well region 122, the area of a channel region (at the junction between the well region 122 and the gate structure 150) of the semiconductor device can be increased. However, it will lead to a rise in the resistance of the semiconductor device, and thus the proportion of the third part 150C of the gate structure 150 in contact with the well region 122 can be controlled, to control the resistance of the semiconductor device.

To sum up, some embodiments of the present disclosure relate to a semiconductor device, and a gate structure of the semiconductor device has a first part, a second part and a third part from bottom to top. The width of the third part is greater than the width of the second part, and the width of the first part is greater than the width of the second part. The first part of the gate structure can be used to avoid electric field concentration at the corner of the gate structure, which can thus reduce the on resistance of the semiconductor device. The third part of the gate structure can be used to reduce the part where the second part of the gate structure overlaps with the source region, to reduce the capacitance between the source region and the gate layer, which can diminish the impact of the capacitance on the semiconductor device.

Only some, not all of the embodiments of the present disclosure are described above, and any equivalent changes made to the technical solutions of the present disclosure by those of ordinary skill in the art by reading the specification of the present disclosure are all covered by the claims of the present disclosure.

What is claimed is:

1. A method of manufacturing a semiconductor device, comprising:
- forming an epitaxial layer on a substrate;
- forming a well region and a source region in the epitaxial layer;
- forming a first trench in the epitaxial layer, a corner of the first trench having a round corner protruding to the well region;
- forming a second trench in the epitaxial layer, a bottom of the second trench being higher than a bottom of the first trench, and a width of the second trench being greater than a width of the first trench; and
- forming a gate structure in the first trench and the second trench.

2. The method of claim 1, wherein forming the first trench in the epitaxial layer comprises:
- forming a vertical side wall of the first trench in the epitaxial layer, the bottom of the first trench exposing a drift region of the epitaxial layer; and
- performing a selective etching procedure, to form the round corner protruding to the well region at the corner of the first trench, a rate of etching the well region by the selective etching procedure being greater than a rate of etching the drift region.

3. The method of claim 1, wherein during forming of the second trench in the epitaxial layer, the bottom of the second trench exposes the well region.

4. The method of claim 1, wherein during forming of the second trench in the epitaxial layer, the bottom of the second trench is higher than a bottom of the source region.

5. The method of claim 1, wherein the gate structure comprises:
- a gate dielectric layer, wherein a width of the gate dielectric layer in the second trench is greater than a width of the gate dielectric layer in the first trench; and
- a gate layer, surrounded by the gate dielectric layer.

6. The method of claim 5, wherein a side wall of the gate layer is substantially vertical to a surface of the substrate.

7. The method of claim 5, wherein the first trench further has a vertical side wall, and a width of the gate dielectric layer surrounded by the round corner is greater than a width of the gate dielectric layer surrounded by the vertical side wall.

8. The method of claim 1, further comprising:

forming a shielding region at the bottom of the first trench.

9. The method of claim 1, further comprising:

forming a source electrode on the well region and the source region; and forming a drain electrode below the substrate.

10. The method of claim 1, wherein after forming the first trench in the epitaxial layer, a width of the bottom of the first trench is greater than a width of a top of the first trench.

11. A semiconductor device, comprising:

a substrate;

an epitaxial layer, on the substrate;

a gate structure, in the epitaxial layer, wherein the gate structure has a first part, a second part and a third part from bottom to top, a width of the third part is greater than a width of the second part, and a width of the first part is greater than the width of the second part, a width of a gate dielectric layer of the gate structure at the third part is greater than a width of the gate dielectric layer of the gate structure at the second part;

a source electrode, on the epitaxial layer; and a drain electrode, below the substrate.

12. The semiconductor device of claim 11, wherein the epitaxial layer comprises:

a source region, adjacent to the third part of the gate structure, wherein a bottom of the third part of the gate structure is higher than a bottom of the source region; and a well region, adjacent to the source region and the gate structure.

13. The semiconductor device of claim 12, wherein the second part of the gate structure has a vertical side wall, and the second part of the gate structure is in contact with the source region and the well region at the same time.

14. The semiconductor device of claim 11, wherein the epitaxial layer comprises:

a source region, adjacent to the third part of the gate structure; and a well region, adjacent to the source region and the gate structure, wherein the third part of the gate structure is in contact with the well region and the source region.

15. The semiconductor device of claim 14, wherein the first part of the gate structure is in contact with the well region.

16. The semiconductor device of claim 15, further comprising:

a shielding region at a bottom of the gate structure.

17. The semiconductor device of claim 16, wherein the source region has a first conductivity type, the well region and the shielding region have a second conductivity type, and the second conductivity type is different from the first conductivity type.

18. The semiconductor device of claim 11, wherein the gate structure further comprises: a gate layer surrounded by the gate dielectric layer, and the width of the gate dielectric layer at the third part of the gate structure is greater than a width of the gate dielectric layer at the first part of the gate structure.

19. The semiconductor device of claim 18, wherein the width of the gate dielectric layer at the first part of the gate structure is greater than the width of the gate dielectric layer at the second part of the gate structure.

20. The semiconductor device of claim 18, wherein the first part of the gate structure has a round corner protruding outward.

* * * * *